United States Patent
Henning et al.

(10) Patent No.: US 11,520,705 B1
(45) Date of Patent: Dec. 6, 2022

(54) INPUT/OUTPUT (I/O) MEMORY MANAGEMENT UNIT (IOMMU) MULTI-CORE INTERFERENCE MITIGATION

(71) Applicant: Rockwell Collins, Inc., Cedar Rapids, IA (US)

(72) Inventors: Carl J. Henning, Cedar Rapids, IA (US); David J. Radack, Robins, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 326 days.

(21) Appl. No.: 16/697,536

(22) Filed: Nov. 27, 2019

(51) Int. Cl.
*G06F 9/38* (2018.01)
*G06F 12/0891* (2016.01)
*G06F 9/50* (2006.01)
*G06F 12/0817* (2016.01)
*G06F 9/48* (2006.01)
*G06F 9/30* (2018.01)
*G06F 30/30* (2020.01)
*G06F 12/1081* (2016.01)
(Continued)

(52) U.S. Cl.
CPC ...... *G06F 12/0891* (2013.01); *G06F 9/30098* (2013.01); *G06F 9/3891* (2013.01); *G06F 9/4843* (2013.01); *G06F 9/5011* (2013.01); *G06F 12/0815* (2013.01); *G06F 12/0828* (2013.01); *G06F 12/1081* (2013.01); *G06F 13/28* (2013.01); *G06F 30/30* (2020.01); *G06F 2212/303* (2013.01)

(58) Field of Classification Search
None
See application file for complete search history.

(56) References Cited

U.S. PATENT DOCUMENTS

| | | | |
|---|---|---|---|
| 5,263,142 A | 11/1993 | Watkins et al. | |
| 6,636,906 B1 | 10/2003 | Sharma et al. | |
| 8,069,308 B2 | 11/2011 | Larson et al. | |

(Continued)

FOREIGN PATENT DOCUMENTS

| | | |
|---|---|---|
| EP | 2090897 B1 | 7/2011 |
| EP | 3109765 B1 | 1/2019 |

*Primary Examiner* — Michael Sun
(74) *Attorney, Agent, or Firm* — Suiter Swamtz pc llo

(57) ABSTRACT

A multicore processing environment (MCPE) is disclosed. In embodiments, the MCPE includes multiple processing cores hosting multiple user applications configured for simultaneous execution. The cores and user applications share system resources including main memory and input/output (I/O) domains, each I/O domain including multiple I/O devices capable of requesting inbound access to main memory through an I/O memory management unit (IOMMU). For example, the IOMMU cache associates unique cache tags to each I/O device based on device identifiers or settings determined by the system registers, caching the configuration data for each I/O device under the appropriate cache tag. When each I/O device requests main memory access, the IOMMU cache refers to the appropriate configuration data under the corresponding unique cache tag. This prevents contention in the IOMMU cache caused by one device evicting the cache entry of another, minimizing interference channels by reducing the need for main memory access.

12 Claims, 3 Drawing Sheets

(51) Int. Cl.
    *G06F 12/0815*    (2016.01)
    *G06F 13/28*      (2006.01)

(56) References Cited

U.S. PATENT DOCUMENTS

| | | | |
|---|---|---|---|
| 9,086,973 B2 * | 7/2015 | Vorbach | G06F 12/0815 |
| 9,514,050 B1 * | 12/2016 | Agarwal | G06F 12/0806 |
| 9,940,241 B1 | 4/2018 | Mehrotra et al. | |
| 10,223,306 B2 | 3/2019 | Gittins | |
| 10,642,501 B1 * | 5/2020 | Patel | G06F 12/1009 |
| 11,030,126 B2 * | 6/2021 | Koufaty | G06F 3/0604 |
| 2009/0204769 A1 | 8/2009 | Heil et al. | |
| 2013/0262736 A1 * | 10/2013 | Kegel | G06F 12/1081 |
| | | | 711/3 |
| 2015/0205724 A1 | 7/2015 | Hancock et al. | |

\* cited by examiner

INPUT/OUTPUT (I/O) MEMORY MANAGEMENT UNIT (IOMMU) MULTI-CORE INTERFERENCE MITIGATION

TECHNICAL FIELD

Embodiments of the inventive concepts disclosed herein are directed generally to safety-critical processing systems and more particularly to memory management within a multicore system-on-a-chip (SoC).

BACKGROUND

Multi-core avionics certification allows multiple applications to be executed on a single processor card, e.g., a multi-core processing environment (MCPE) encompassing several physical or virtual processing cores housed on a single system-on-a-chip (SoC). Modern SoC devices include input/output (I/O) memory management units (IOMMU) capable of mapping or translating virtual addresses (e.g., corresponding to I/O devices associated with the executing applications) to physical addresses (e.g., within main system memory). This virtual/physical address translation may be configured according to configuration data stored within main memory. In some implementations some configuration data may be cached within the IOMMU.

However, when a device in communication with the SoC needs to access main memory (e.g., reading from or writing to) and the configuration data particular to the accessing device is not found within the IOMMU cache, the configuration data must be read from main memory. Reading the IOMMU configuration data from main memory generates two general interference channels with respect to other devices or processing cores within the SoC. First, reading the configuration data from main memory causes contention on the memory bus, interfering with other attempts to access main memory. For the second interference channel, while a particular IOMMU operation is waiting for the configuration data to be fetched, other read/write operations by peripherals through that IOMMU are delayed—a delay which must be taken into consideration with respect to multi-core certification of safety-critical applications (e.g., those applications which must complete within their allotted time).

SUMMARY

A multicore processing environment (MCPE) is disclosed. In embodiments, the MCPE includes a plurality of processing cores including system registers and hosting various user applications configured to run simultaneously thereon. The processing cores are in communication with shared system resources (SSR), e.g., main memory and peripheral input/output (I/O) devices (e.g., direct memory access (DMA) engines, network devices, PCI devices) initialized by the system registers. The I/O devices request access to main memory, e.g., in the course of executing the user applications. Access to main memory may be controlled by an I/O memory management unit (IOMMU) connected to the various I/O domains in which the I/O devices may be grouped. Based on the initialization or configuration by the system registers, the IOMMU associates unique cache tags with each requesting peripheral device, such that the configuration data particular to that device are cached according to the unique cache tag and the IOMMU can access the configuration files to execute I/O requests without eviction that might otherwise lead to cache misses and increased interference.

A system-on-chip (SoC) is also disclosed. In embodiments, the SoC includes multiple processing cores configured to simultaneously host multiple user applications, the processing cores further including SoC registers for initialization and configuration of peripheral input/output (I/O) devices. The processing cores are in communication with shared system resources (SSR) including main memory units and I/O domains, each I/O domain including one or more peripheral I/O devices initialized by the SoC registers. The SoC includes an I/O memory management unit (IOMMU) for controlling access to main memory from the I/O domains. The IOMMU includes an IOMMU cache, whereby the IOMMU associates unique cache tags with each peripheral I/O device requesting inbound access to main memory, based on the SoC initialization of each peripheral device. The IOMMU caches configuration data specific to the requesting device under each unique cache tag, such that the IOMMU can refer to the correct configuration data when executing I/O requests from a given peripheral device without evicting other devices or retrieving the configuration data from main memory.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
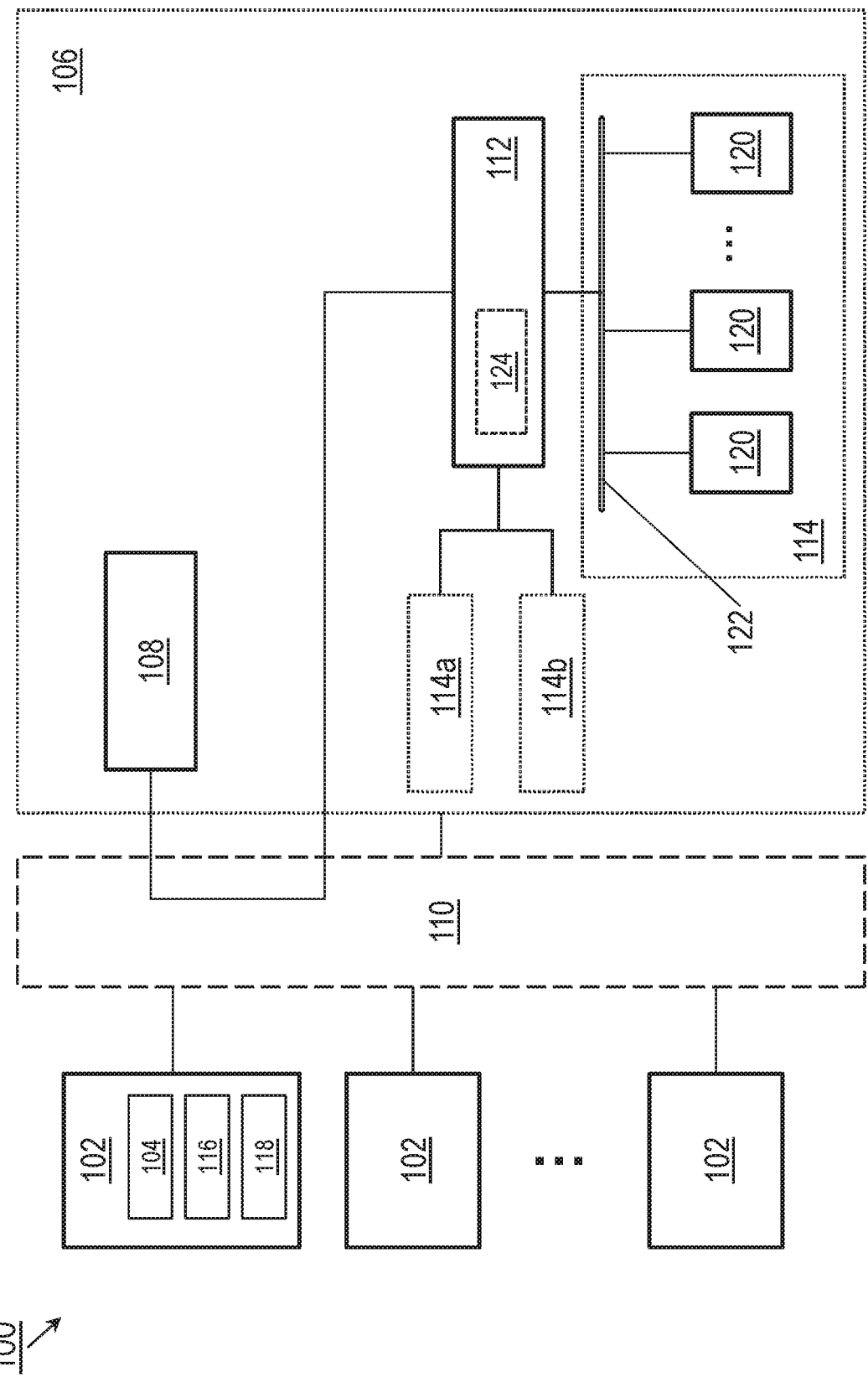
FIG. 1 is a block diagram illustrating a multi-core processing environment (MCPE) in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Referring to FIG. 1, a multi-core processing environment (MCPE) 100 is disclosed. The MCPE 100 may include processing cores 102, system registers 104 (e.g., processor registers, system-on-chip (SoC) registers), and shared system resources 106 (SSR) including main memory 108 (e.g., double data rate (DDR) random access memory (RAM)), coherency fabric 110, input/output (I/O) memory management units 112 (IOMMU), and I/O domains 114, 114a-b.

In embodiments, the MCPE 100 may be embodied in a single system-on-a-chip (SoC) installed as a component of a larger aircraft-based avionics processing system. The processing cores 102 of the MCPE 100 (e.g., an MCPE may incorporate two, four, or any other appropriate whole number of cores) may incorporate physical processing cores or virtual processing cores, e.g., one or more physical cores partitioned into virtual cores. Each processing core 102 may house multiple user applications 116 configured for simultaneous execution. For example, an aircraft-based avionics MCPE 100 may incorporate a variety of safety-critical applications, e.g., applications that must complete within their allotted timeframe or which are essential to safe flight, and mission-critical applications, e.g., applications which may not be essential to safe flight but which may be allotted additional time to execute. In some embodiments, one or more operating systems 118 (OS; e.g., guest operating systems (GOS)) may be running on a processing core 102, or across multiple processing cores of the MCPE 100 (e.g., as a partition or virtual core comprising all or part of multiple processing cores).

In embodiments, the SSR 106 include those resources for which multiple processing cores 102 (or the user applications 116 executing thereon) may compete with each other; e.g., use of a particular resource by a given processing core may interfere with or degrade the use of that resource by other cores of the MCPE 100, which in turn may lead to latency issues for those cores and applications. Each user application 116 may be associated with one or more peripheral devices 120 (e.g., direct memory access (DMA) engines, peripheral component interconnect (PCI) devices). For example, each I/O domain 114, 114a-b may include several peripheral devices 120 in communication with the IOMMU 112 via an I/O bus 122. In the course of execution, a user application 116 may invoke various peripheral devices 120 with I/O operations to read from, or write to, physical addresses within the main memory 108. Each peripheral device 120 may in turn request access to the main memory 108 via the IOMMU 112. The IOMMU 112 may refer to configuration data (e.g., configuration files), or data structures within the main memory 108 (or within the IOMMU cache 124) for controlling, e.g., address/window translation or memory access. Access to the main memory 108 may be provided by the coherency fabric 110 (or, e.g., via system buses connecting the IOMMU 112 to the main memory).

Figure 2A:
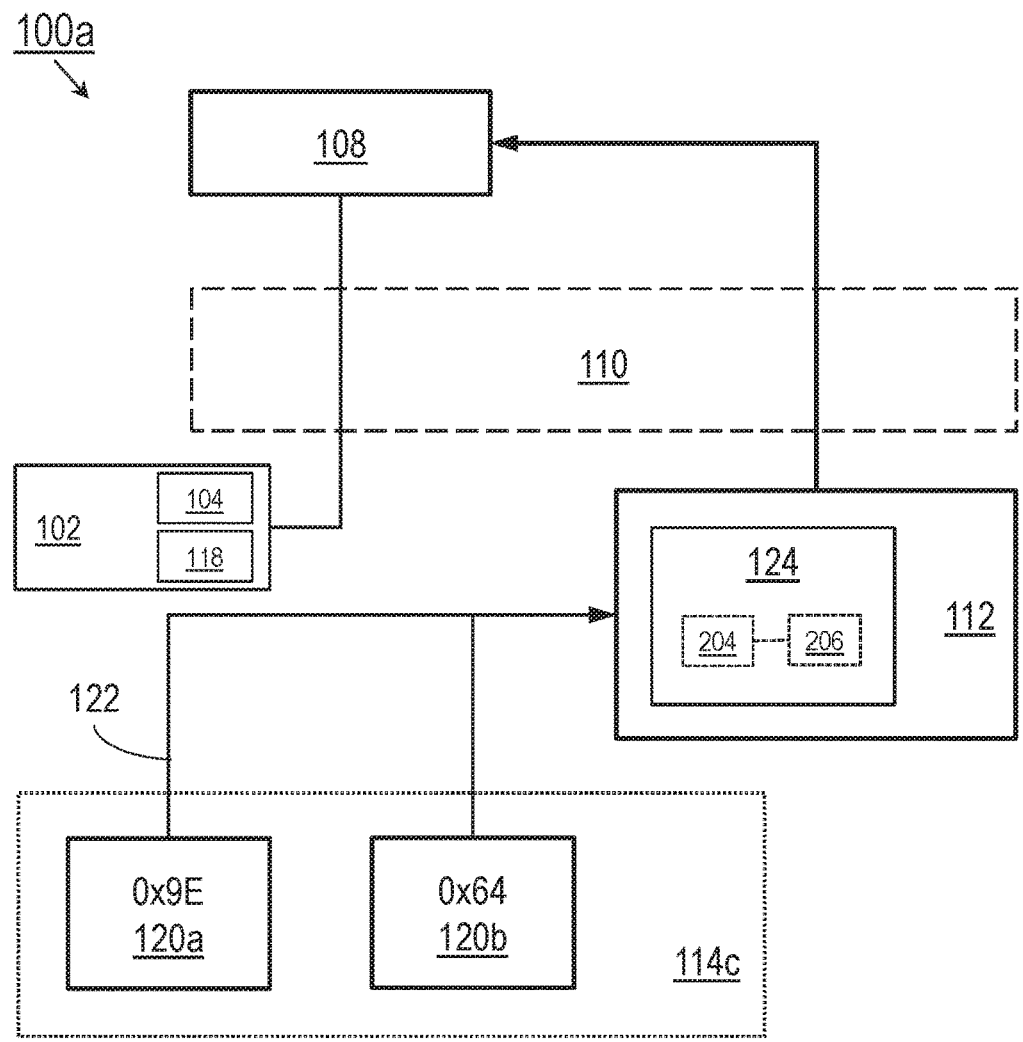
FIG. 2A is a flow diagram illustrating shared system resources of the MCPE of FIG. 1 in accordance with example embodiments of this disclosure.
Figure 2B:
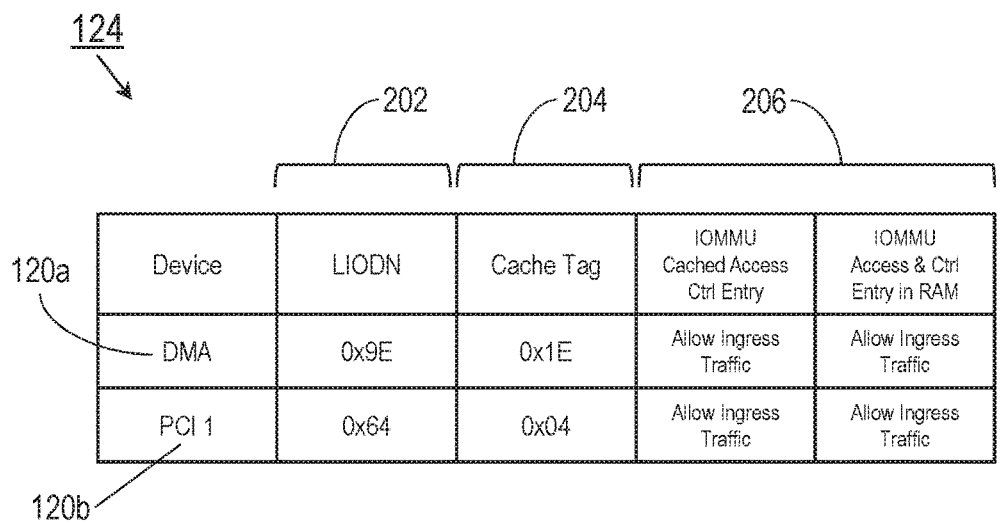
FIG. 2B is a tabular illustration of the input/output (I/O) memory management unit (IOMMU) cache of FIG. 2A.

Referring to FIGS. 2A and 2B, the MCPE 100a may be implemented and may function similarly to the MCPE 100 of FIG. 1, except that the system registers 104 may mitigate or eliminate potential interference at startup, e.g., at initial configuration of the peripheral devices 120a-b.

In embodiments, the system registers 104 may initialize each peripheral device 120a-b by assigning to the peripheral device a unique logical I/O device number 202 (LIODN; e.g., logical device identifier), such that no two LIODNs conflict or collide. Based on each assigned LIODN 202, the IOMMU 112 may determine a cache tag 204 corresponding to the peripheral device 120a-b and cache any configuration data 206 for that peripheral device under the corresponding cache tag. This approach ensures each peripheral device 120a-b a unique entry in the IOMMU cache 124 and reduces (or eliminates) the interference caused by IOMMU cache reloads from main memory 108. For example, the I/O domain 114c may include (e.g., connected via PCI slot) a DMA engine (peripheral device 120a) and a network device (peripheral device 120b) among other logical I/O devices connected to the IOMMU 112 via I/O bus 122. Within the IOMMU cache 124, the unique cache tag 204 assigned to the DMA engine 120a (e.g., assigned LIODN 202 value of 0x9E) may reference configuration data 206 relevant to servicing I/O requests by the DMA engine. Similarly, the unique cache tag 204 assigned to the network device 120b (e.g., assigned LIODN 202 value of 0x64) may reference configuration data 206 relevant to servicing I/O requests by the network device.

In embodiments, the relevant configuration data 206 may be loaded to the IOMMU cache 124 (and tagged with the appropriate cache tags 204 based on assigned LIODN 202 values) when the peripheral devices 120a-b initially request inbound access to the main memory 108. Once the relevant configuration data 206 has been loaded to the IOMMU cache 124, any subsequent I/O requests by the peripheral devices 120a-b for inbound access to the main memory 108 will not cause cache misses with respect to the IOMMU cache, eliminating any further interference on the coherency fabric 110. In some embodiments, LIODNs 202 may be assigned by the system registers 104 according to configurable settings determined by an OS 118 running on the processing cores 102.

Figure 3A:
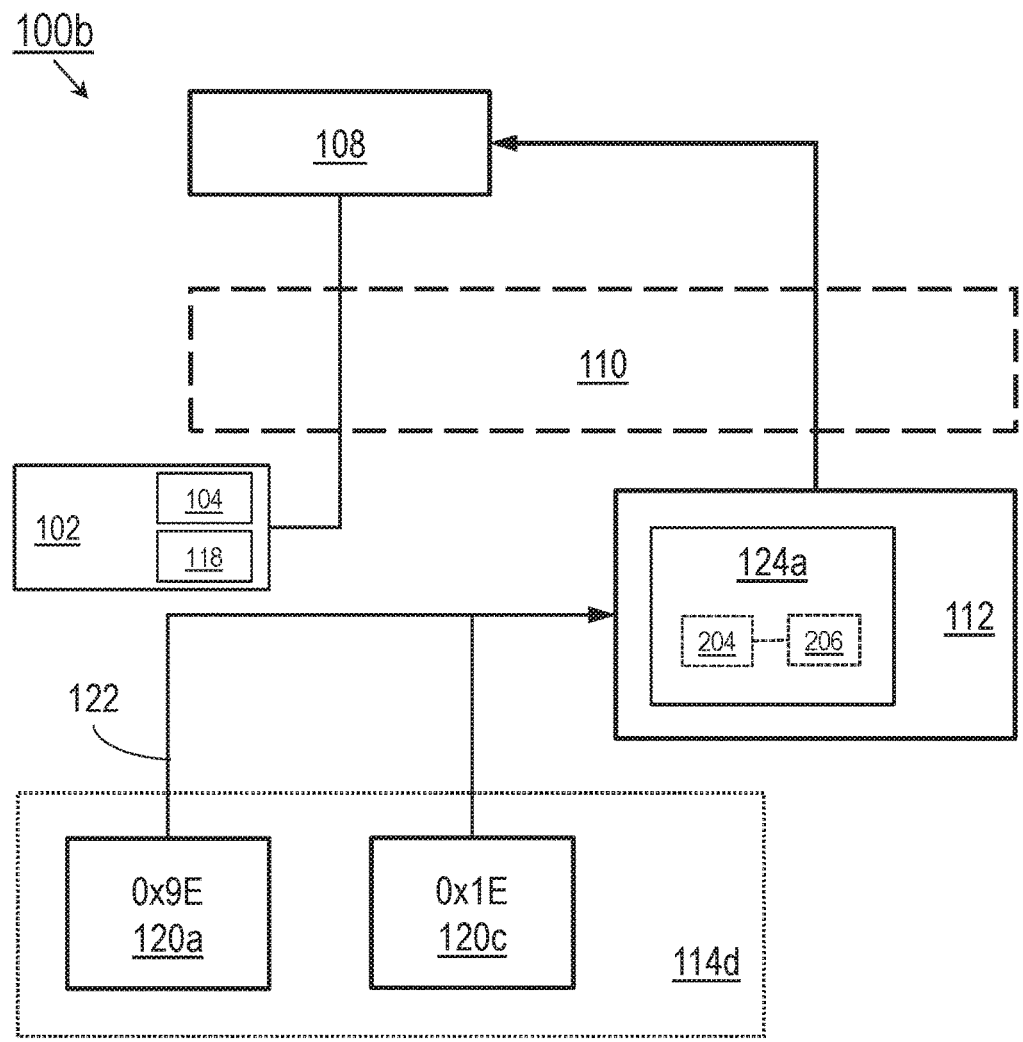
FIG. 3A is a flow diagram illustrating shared system resources of the MCPE of FIG. 1 in accordance with example embodiments of this disclosure.
Figure 3B:
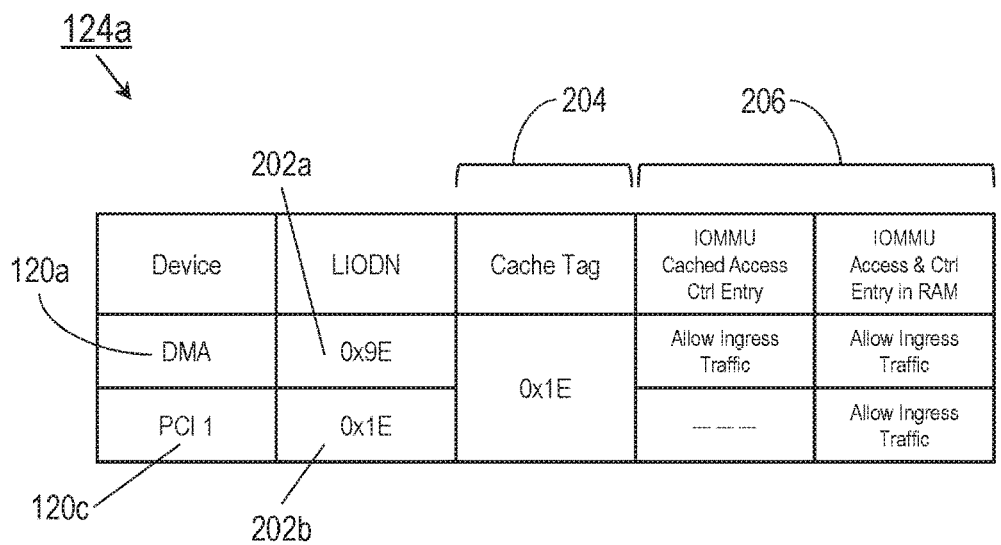
FIG. 3B is a tabular illustration of the input/output (I/O) memory management unit (IOMMU) cache of FIG. 3A.

Referring to FIGS. 3A and 3B, the MCPE 100b, I/O domain 114d, and IOMMU cache 124a may be implemented and may function similarly to the MCPE 100a, I/O domain 114c, and IOMMU cache 124 of FIGS. 2A and 2B, except that the I/O domain 114d may include a peripheral device 120c (e.g., PCI device) not associated with inbound traffic to the main memory 108.

In embodiments, the IOMMU cache 124a may not have sufficient space to assign a unique cache tag 204 to every peripheral device 120a, 120c of every I/O domain 114d. Accordingly, the system registers 104 may assign LIODNs 202a-b to the peripheral devices 120a, 120c such that the IOMMU 112 assigns to the two peripheral devices, e.g., the DMA engine 120a and PCI device 120c, a common cache tag 204 based on their assigned LIODNs. For example, the DMA engine 120a may make regular I/O requests for inbound access to main memory 108, but the PCI device 120c has no inbound traffic and thus does not make I/O requests for inbound access. The configuration data 206 associated with the DMA engine 120a may be loaded by the IOMMU cache 124a (e.g., upon the initial request for inbound access by the DMA engine), as only the DMA engine 120a requests inbound access to main memory 108. As the PCI device 120c has no inbound traffic, the PCI device cannot cause a collision of LIODNs 202a-b in the IOMMU cache 124a.

In embodiments, loading the appropriate configuration data 206 directly to the IOMMU cache 124 may reduce or eliminate RAM contention (e.g., within the coherency fabric 110) caused by retrieving data structures from the main memory 108 not otherwise found in the IOMMU cache, as well as cascading latency issues for other peripheral devices 120a, 120c within a given I/O domain 114d.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

We claim:

1. A multicore processing environment (MCPE), comprising:
a plurality of processing cores associated with at least one user application configured to execute thereon, the plurality of processing cores including one or more system registers;
one or more shared system resources (SSR) communicatively coupled to the plurality of processing cores, the one or more SSR comprising:
at least one main memory unit;
a plurality of peripheral devices configurable via the one or more system registers, the plurality of peripheral devices including at least one requesting peripheral device configured for generating at least one I/O request associated with the at least one user application;
and
at least one I/O memory management unit (IOMMU) communicatively coupled to the main memory unit by at least one coherency fabric and to the plurality of peripheral devices by at least one I/O bus, the IOMMU including at least one IOMMU cache configured to:
assign a cache tag to each requesting peripheral device; and
cache configuration data for each requesting peripheral device under the assigned cache tag;
the IOMMU configured to execute each I/O request according to the configuration data associated with the assigned cache tag.

2. The MCPE of claim 1, wherein the IOMMU is configured to execute the at least one I/O request by allowing the requesting peripheral device to access the main memory unit.

3. The MCPE of claim 1, wherein:
the one or more system registers are configured to initialize the at least one requesting peripheral device by assigning a unique logical device identifier thereto;
and
the IOMMU is configured to assign the cache tag to each associated requesting peripheral device based on the corresponding logical device identifier.

4. The MCPE of claim 3, wherein:
the at least one user application includes at least one operating system (OS) configured to execute on the plurality of processing cores;
and
the one or more system registers are configured to initialize the at least one requesting peripheral device based on at least one setting associated with the OS.

5. The MCPE of claim 1, wherein the IOMMU cache is configured to assign at least one-cache tag to a requesting peripheral device and a non-requesting peripheral device of the plurality of peripheral devices, the non-requesting peripheral device not associated with inbound access to the main memory unit.

6. The MCPE of claim 1, wherein the MCPE is embodied in at least one system on a chip (SoC).

7. The MCPE of claim 1, wherein:
the MCPE is embodied in an aircraft-based avionics processing system;
and
the at least one user application includes at least one safety-critical application.

8. A system on a chip (SoC), comprising:
one or more processing cores associated with at least one user application configured to execute thereon, the one or more processing cores including one or more system registers;
at least one main memory unit;
one or more input/output (I/O) domains operatively coupled to the one or more processing cores by a coherency fabric, each I/O domain comprising one or more peripheral devices configurable via the one or more system registers, the one or more peripheral devices including at least one requesting peripheral device configured for generating at least one I/O request associated with the main memory unit; and at least one I/O memory management unit (IOMMU) operatively coupled to the main memory unit and to the one or more I/O domains, the IOMMU including an IOMMU cache configured to:

assign a cache tag to each requesting peripheral device; and cache configuration data for each requesting peripheral device under the assigned cache tag;

the IOMMU configured to:

receive the at least one I/O request from each requesting peripheral device; and execute each I/O request according to the configuration data corresponding to the cache tag assigned to the requesting peripheral device.

9. The SoC of claim 8, wherein the at least one IOMMU is configured to execute the at least one I/O request by allowing the requesting peripheral device to access the main memory unit according to the configuration data corresponding to the assigned cache tag.

10. The SoC of claim 8, wherein:

the one or more system registers are configured to initialize the at least one requesting peripheral device by assigning a unique logical device identifier thereto; and the IOMMU is configured to assign the cache tag to each requesting peripheral device based on the logical device identifier assigned to the requesting peripheral device.

11. The SoC of claim 10, wherein:

the at least one user application includes at least one operating system (OS) configured to execute on the plurality of processing cores; and the one or more system registers are configured to initialize the at least one requesting peripheral device based on at least one setting associated with the OS.

12. The SoC of claim 8, wherein the IOMMU cache is configured to assign at least one cache tag to a requesting peripheral device and at least one non-requesting peripheral device, the at least one non-requesting peripheral device not associated with inbound access to the main memory unit.

* * * * *